United States Patent
Gass et al.

(10) Patent No.: US 8,086,925 B2
(45) Date of Patent: Dec. 27, 2011

(54) METHOD AND SYSTEM FOR LBIST TESTING OF AN ELECTRONIC CIRCUIT

(75) Inventors: Benjamin Robert Gass, Pflugerville, TX (US); Abel Alaniz, Cedar Park, TX (US); Asher Shlomo Lazarus, Austin, TX (US); Timothy M. Skergan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 290 days.

(21) Appl. No.: 12/123,540

(22) Filed: May 20, 2008

(65) Prior Publication Data

US 2009/0292963 A1    Nov. 26, 2009

(51) Int. Cl.
*G01R 31/28* (2006.01)
(52) U.S. Cl. .......................................... 714/738
(58) Field of Classification Search .................. 714/732, 714/733, 736, 738
See application file for complete search history.

(56) References Cited

U.S. PATENT DOCUMENTS

| | | |
|---|---|---|
| 5,173,906 A | 12/1992 | Dreibelbis et al. |
| 6,643,807 B1 | 11/2003 | Heaslip et al. |
| 6,671,839 B1 * | 12/2003 | Cote et al. ............ 714/726 |
| 6,978,408 B1 | 12/2005 | Huott et al. |
| 7,076,706 B2 | 7/2006 | Eckelman et al. |
| 7,346,823 B1 * | 3/2008 | Maheshwari et al. ......... 714/733 |
| 7,444,568 B2 * | 10/2008 | Morrison et al. ............ 714/726 |
| 7,509,551 B2 * | 3/2009 | Koenemann et al. ......... 714/732 |
| 7,558,996 B2 * | 7/2009 | Kiryu ............................ 714/726 |
| 7,644,333 B2 * | 1/2010 | Hill et al. ..................... 714/732 |
| 2003/0115525 A1 | 6/2003 | Hill et al. |
| 2004/0216061 A1 | 10/2004 | Floyd et al. |
| 2007/0061637 A1 | 3/2007 | Ward et al. |
| 2007/0101194 A1 | 5/2007 | Lockwood et al. |

* cited by examiner

*Primary Examiner* — James C Kerveros
(74) *Attorney, Agent, or Firm* — Patrick E. Caldwell, Esq.; The Caldwell Firm, LLC

(57) ABSTRACT

A method for testing an electronic circuit comprises selecting a first log interval, a first log start pattern, a first log end pattern, and a first subset range of LBIST patterns from a plurality of LBIST patterns arranged in an order, wherein each LBIST pattern of the subset range of LBIST patterns causes an associated output of an electronic circuit. The method tests an electronic circuit in a first test by applying to the electronic circuit the first subset range of LBIST patterns sequentially in the order, thereby generating a first plurality of associated outputs. The method stores a first subset of associated outputs based on the first log interval, the first log start pattern, and the first log end pattern. The method compares the subset of associated outputs with known outputs to identify a first output mismatch.

19 Claims, 3 Drawing Sheets

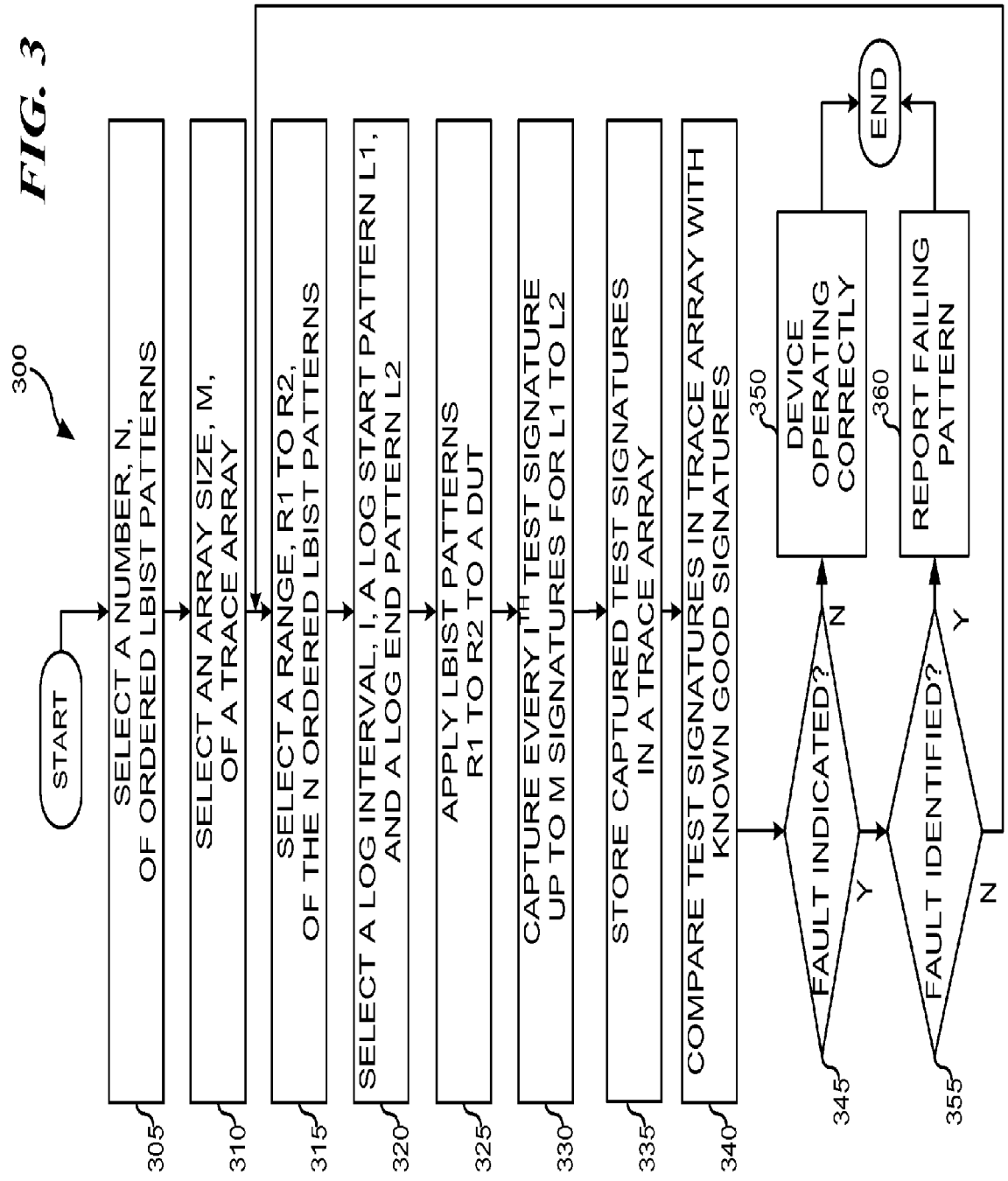

METHOD AND SYSTEM FOR LBIST TESTING OF AN ELECTRONIC CIRCUIT

TECHNICAL FIELD

The present invention relates generally to the field of computer testing and performance and, more particularly, to a system and method for testing an electronic circuit.

BACKGROUND OF THE INVENTION

Modern electronic devices, such as microprocessors, often include a complex matrix of logic gates and other circuitry arranged to perform particular tasks and functions. These logic gates are often interconnected in two parallel arrangements, one arrangement for operation, and another arrangement for testing the functionality of the circuit. Linking a plurality of latches together into a "scan chain" is one popular method of arranging logic units for functional/operational testing. Grouping components into groups of "stumps" is another popular method of arranging logic units for functional/operational testing. One skilled in the art will appreciate that there are a wide variety of ways to arrange circuit components to facilitate testing. As used herein, "stump" or "stumps" refers generally to an arrangement of logic units or other circuits coupled together for testing.

One popular approach to testing circuits is to apply a number of test patterns to a device under test (DUT), as a whole or divided into stumps, comparing the resultant output with a known good output for that test pattern. One skilled in the art will appreciate that there are a wide variety of systems and methods for generating test patterns that provide inputs to the DUT that help identify DUT faults or malfunctions.

One popular mechanism for generating and applying test patterns to a DUT is the logic built-in self-test (LBIST) approach. Generally, in LBIST testing, a user creates an LBIST test pattern that causes the DUT to run N number of internally-generated pseudo-random LBIST patterns on itself, compressing the results into multiple input shift registers (MISRs), described in more detail below. As used herein, an "LBIST pattern" is one of a plurality of test patterns generated by the DUT in response to an "LBIST test pattern."

As the number and complexity of circuit components and circuits in modern electronic devices has grown, so have the number of LBIST patterns required to analyze a chip, and the time required to set up, apply, and analyze the MISR outputs the LBIST patterns generate. For example, it is not unusual for an LBIST test run to apply on the order of 2 million or more LBIST patterns. A large number of LBIST patterns increases the time required to identify "failing patterns," that is, LBIST patterns that cause MISR outputs that do not match a known output, which indicates that the DUT does not function in the manner expected for the associated LBIST test pattern.

In conventional LBIST systems, the DUT includes a pseudo-random pattern generator (PRPG) that generates the LBIST patterns based on the "seed" LBIST test pattern. As such, most conventional LBIST patterns are arranged in a particular order (the deterministic PRPG order), and typical systems apply the LBIST patterns to the DUT in that order. In particular, for each LBIST pattern, typical systems clock in the current LBIST pattern to the DUT, perform a functional clock cycle, and clock out the resultant DUT state (the "output") to the MISRs. The MISRs compress the output into a "signature."

Because of the nature of the output capture MISRs, a DUT state output that deviates from the expected output for a given LBIST pattern, corrupts the MISR outputs (the signatures) for subsequent LBIST patterns. And the corrupted subsequent signatures look like failing LBIST patterns. Therefore, many typical conventional test systems employ a "binary search" approach to identifying failing LBIST patterns.

The binary search approach is well known to those skilled in the art and generally consists of dividing the number of applied LBIST patterns into narrower and narrower halves, until the process identifies the first failing LBIST pattern. This approach, however, requires a binary search of log 2 (N) iterations to find a failing LBIST pattern, where N is the number of LBIST patterns. For example, for a DUT tested with 1M (million) LBIST patterns, where the $264,001^{st}$ LBIST pattern fails, a typical test system would run the first 1M LBIST patterns, which would indicate a failure in some LBIST pattern before the one millionth LBIST pattern. The system runs the series of LBIST patterns again, this time running only the first 500 thousand LBIST patterns, which is one-half of the full run. The $500,000^{th}$ LBIST pattern MISR output does not match the known output, and so the system now knows that the failing LBIST pattern is in the first half of the sequence of LBIST patterns.

The system next runs the first 250 thousand LBIST patterns, after which, the MISR output does match the expected output. The system now knows that the failing LBIST pattern is between the $250,001^{st}$ and the $499,999^{th}$ LBIST pattern. The system then runs the first 275,000 LBIST patterns (which fails), then the first 262,500 LBIST patterns (which passes), then the first 268,750 (which fails), and so forth, narrowing the change in search range until the system finds the failing $264,001^{st}$ LBIST pattern. As described above, this standard binary search approach can identify a failing LBIST pattern in O(log 2(N)) time.

The standard binary search time is not inherently unreasonable, particularly for small numbers of LBIST patterns. However, as the number of LBIST patterns required to properly test a DUT increases, the search time for a standard binary search becomes too long to be practical, especially as compared to the decreasing time window available during the manufacturing process. Other search methods known to those skilled in the art suffer from similar drawbacks.

Therefore, there is a need for a system and/or method for testing an electronic circuit that addresses at least some of the problems and disadvantages associated with conventional systems and methods.

BRIEF SUMMARY

The following summary is provided to facilitate an understanding of some of the innovative features unique to the embodiments disclosed and is not intended to be a full description. A full appreciation of the various aspects of the embodiments can be gained by taking into consideration the entire specification, claims, drawings, and abstract as a whole.

The aforementioned aspects and other objectives and advantages can now be achieved as described herein. A method for testing an electronic circuit comprises selecting a first log interval. The method selects a first log start pattern, a first log end pattern, and a first subset range of LBIST patterns from a plurality of LBIST patterns arranged in an order, wherein each LBIST pattern of the subset range of LBIST patterns causes an associated output of an electronic circuit. The method tests an electronic circuit in a first test by applying to the electronic circuit the first subset range of LBIST patterns sequentially in the order, thereby generating a first plurality of associated outputs. The method stores a first subset of associated outputs based on the first log interval, the first log start pattern, and the first log end pattern. The method compares the subset of associated outputs with known outputs to identify a first output mismatch.

In an alternate embodiment, a system comprises a test engine configured to couple to a device under test (DUT), the DUT comprising a plurality of test stumps. The test engine generates a plurality of LBIST patterns arranged in an order, wherein each LBIST pattern causes an associated output of the DUT and applies a first subset range of LBIST patterns from the plurality of LBIST patterns, thereby generating a first plurality of associated outputs. A trace array coupled to the DUT receives each associated output of the first plurality of associated outputs and stores a first subset of associated outputs based on a first log interval, a first log start pattern and a first log end pattern. A controller coupled to the test engine and the trace array compares the first subset of associated outputs with known outputs to identify a first output mismatch.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

FIG. 3 illustrates a high-level flow diagram depicting logical operational steps of an improved electronic circuit test method, which can be implemented in accordance with a preferred embodiment.

DETAILED DESCRIPTION

Figure 1:
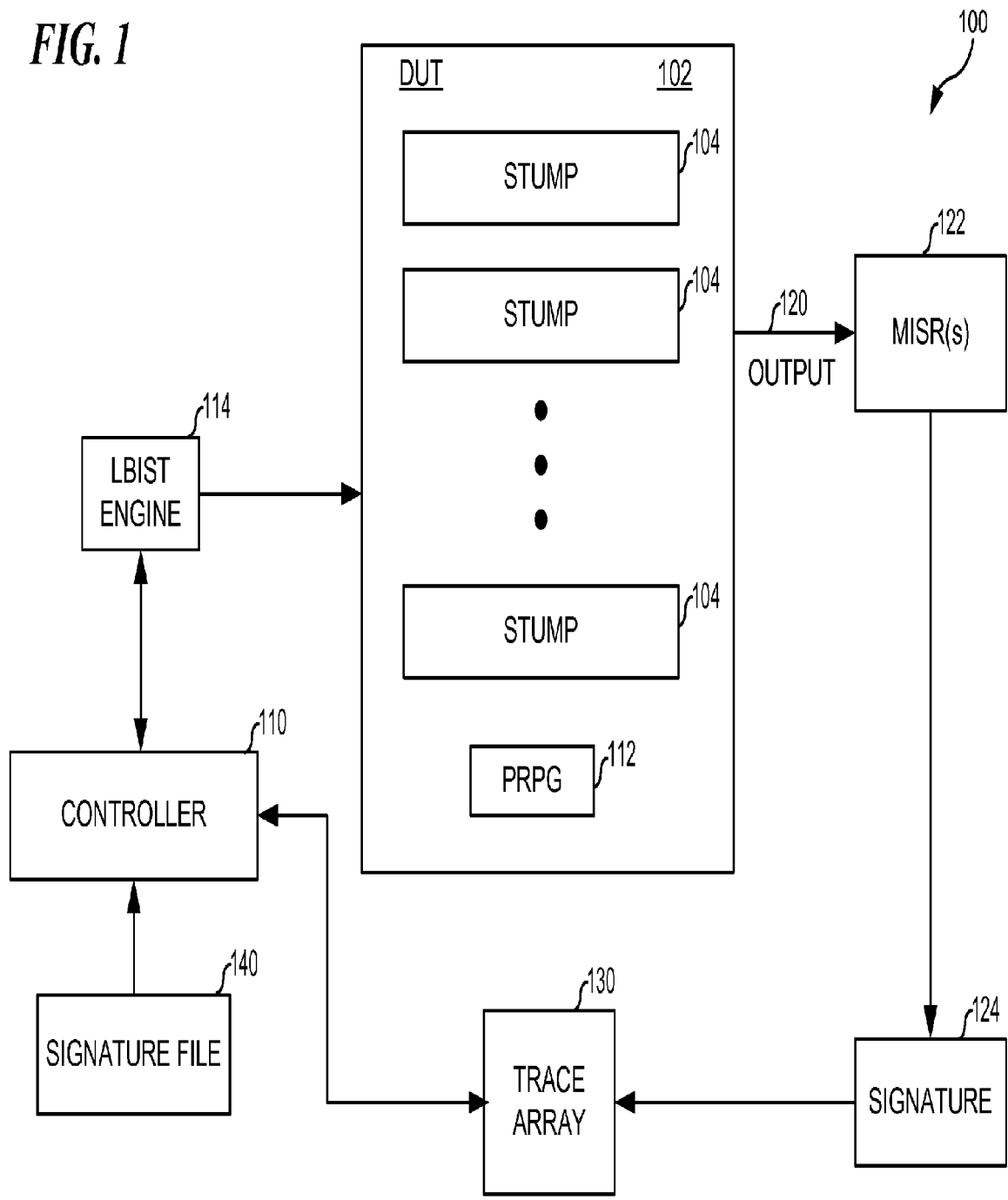
FIG. 1 illustrates a block diagram showing an improved electronic circuit test system in accordance with a preferred embodiment.

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or in some combinations thereof. In a preferred embodiment, however, the functions are performed by a processor such as a computer or an electronic data processor in accordance with code such as computer program code, software, and/or integrated circuits that are coded to perform such functions, unless indicated otherwise.

The invention can take the form of an entirely hardware embodiment, an entirely software embodiment, or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus or otherwise tangible medium that can contain, store, communicate, propagate, or transport the program for use by or in connection with the instruction execution system, apparatus, or device.

The medium can be an electronic, magnetic, optical, electromagnetic, infrared, or semiconductor system (or apparatus or device). Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Referring now to the drawings, FIG. 1 is a high-level block diagram illustrating certain components of a system 100 for an improved method and system for testing an electronic circuit, in accordance with a preferred embodiment of the present invention. System 100 includes a device under test (DUT) 102.

Generally, DUT 102 is the circuit or chip to be tested. Many modern circuits include a number of scan chains or stumps, and as such, DUT 102 includes a plurality of stumps 104. Very generally, system 100 applies an LBIST test pattern to DUT 102, which generates a plurality of LBIST patterns, applying the LBIST patterns to one or more of stumps 104. One or more MISRs 122 compact each output 120 of DUT 102 that results from that application into a signature 124.

More specifically, system 100 includes a controller 110. Controller 110 is an otherwise conventional controller, configured as described below. Controller 110 couples to LBIST engine 114. LBIST engine 114 is an otherwise conventional LBIST engine. Generally, LBIST engine 114 generates an LBIST test pattern based on user input, for transmission to DUT 102 in accordance with commands received from controller 110. One skilled in the art will understand that applying an LBIST test pattern to DUT 102 causes DUT 102 to produce outputs, indicated in FIG. 1 as output 120. In the illustrated embodiment, LBIST engine 114 couples to DUT 102 and is depicted as a separate block from DUT 102 for ease of illustration. In one embodiment, LBIST engine 114, DUT 102, MISRs 122, and trace array 130 (described below) all reside on a common chip.

DUT 102 includes a pseudo-random pattern generator (PRPG) 112. PRPG 112 is an otherwise conventional pseudo-random pattern generator, configured to generate a plurality of ordered pseudo-random LBIST patterns in response to an LBIST test pattern received from LBIST engine 114. Generally, the LBIST patterns generated by PRPG 112 are configured, collectively, to test for a wide variety of problems and faults of one or more stumps 104 of DUT 102. For convenience, as used herein, "LBIST patterns" means the pseudo-random patterns generated by PRPG 112 in response to an LBIST test pattern.

It is often more convenient to compress or compact raw output from DUT 102 into a data signature. As illustrated, system 100 includes MISR(s) 122. Generally, MISR(s) 122 are one or more multiple-input shift registers (MISRs) or other suitable data compactor. MISR 122 couples to DUT 102 to receive raw output from DUT 102 (in response to LBIST pattern stimuli), and to compact the raw output into signatures 124. One skilled in the art will understand that there are a variety of well-known approaches to compacting raw DUT output into a signature.

As illustrated, system 100 includes a trace array 130 coupled to MISR 122 so as to receive one or more of the signatures 124. Trace array 130 is an otherwise conventional trace array modified as described herein. In one embodiment, trace array 130 is an otherwise conventional array, preexisting on DUT 102. In a preferred embodiment, trace array 130 is configured to be wide enough to hold a complete MISR signature in each entry, and to contain a suitable number of entries. In one embodiment, trace array 130 includes 128 entries. Trace array 130 also couples to controller 110. In one embodiment, controller 110 reads the data in trace array 130. In an alternate embodiment, DUT 102 transmits the data in trace array 130 to controller 110.

System 100 also includes a signature file 140. Generally, signature file 140 is an otherwise conventional signature file, and can comprise a storage structure, hardware storage, an abstract data structure, or other suitable configuration. In one embodiment, signature file 140 stores a known good signature output for each test pattern applied to DUT 102. In an alternate embodiment, signature file 140 stores a plurality of known good signature outputs for a plurality of LBIST patterns.

Figure 2:
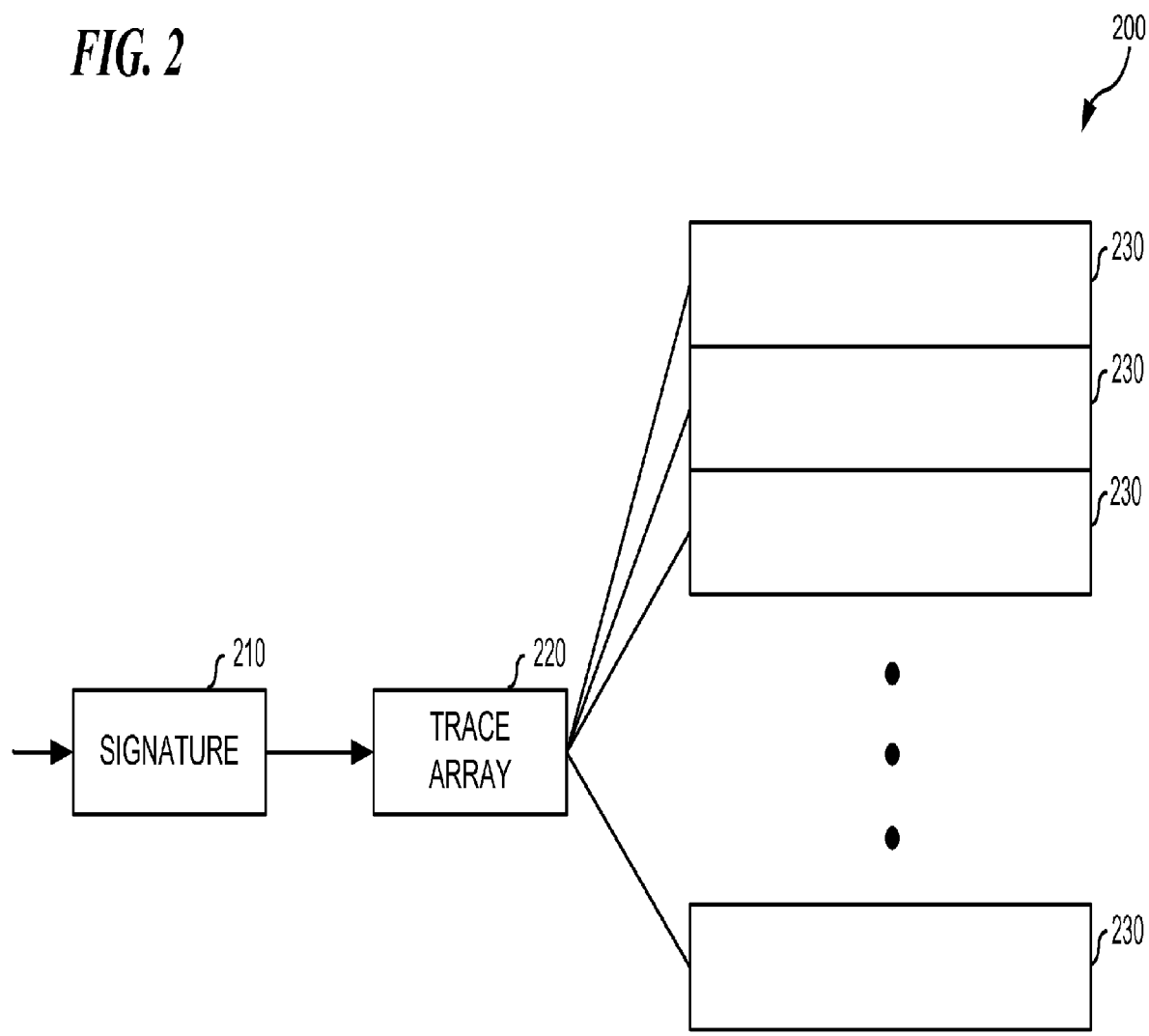
FIG. 2 illustrates a block diagram showing an improved electronic circuit test system in accordance with a preferred embodiment.

Therefore, generally, in one embodiment, controller 110 directs LBIST engine 114 to apply an LBIST test pattern to DUT 102, from which PRPG 112 of DUT 102 generates LBIST patterns for application to one or more stumps 104. In response to the applied LBIST patterns, DUT 102 provides outputs 120 to MISR 122, which compacts the outputs 120 into signatures 124. As described in more detail below, trace array 130 stores a subset of the signatures 124 for comparison with known good signatures from signature file 140. FIG. 2 provides additional detail of trace array 130.

FIG. 2 is a high-level block diagram illustrating certain components of a system 200 for an improved method and system for testing an electronic circuit, in accordance with a preferred embodiment of the present invention. System 200 includes a trace array 220. Trace array 220 is an otherwise conventional memory array, configured as described below.

Generally, trace array 220 includes a plurality of entries 230. In one embodiment, trace array 220 includes M entries, where M is an integer power of 2. As illustrated, trace array 220 receives a signature 210 and stores the received signature into an empty entry 230. In one embodiment, trace array 220 is a predetermined array selected from among a plurality of preexisting arrays of the DUT. System 200 operates as a part of system 100 of FIG. 1.

More particularly, system 100 operates as described with reference to FIG. 3. FIG. 3 illustrates one embodiment of a method for testing an electronic circuit. Specifically, FIG. 3 illustrates a high-level flow chart 300 that depicts logical operational steps performed by, for example, system 100 of FIG. 1, which may be implemented in accordance with a preferred embodiment.

As indicated at block 305, the process begins, wherein a controller selects a number, N, of ordered LBIST patterns. For example, controller 110 selects N LBIST patterns from PRPG 112. In one embodiment, controller 110 selects N LBIST patterns based on input from a user. Next, as illustrated at block 310, a controller selects an array size, M, of a trace array. For example, controller 110 selects an array size M of trace array 130. In one embodiment, M is the number of entries 230 of trace array 220 of FIG. 2. In an alternate embodiment, controller 110 selects a subset M of the numbers of entries in the trace array.

Next, as illustrated at block 315, a controller selects a range, R1 to R2, of the N LBIST patterns. For example, controller 110 selects a subset R1 to R2 of the N LBIST patterns from PRPG 112. In one embodiment, controller 110 selects the subset R1 to R2 based on input from a user. Because LBIST patterns are generally applied in a particular order from a first LBIST pattern, based on the LBIST test pattern, the starting subset pattern R1 will ordinarily be the first LBIST pattern in the set of ordered LBIST patterns and the ending subset pattern R2 can be any subsequent LBIST pattern in the order.

Next, as illustrated at block 320, a controller selects a log interval, I, a log start pattern, L1, and a log end pattern, L2. For example, in one embodiment, controller 110 selects the log interval 1, as 1/M of the number of LBIST patterns in the range R1 to R2, the log start pattern L1 as the $I^{th}$ LBIST pattern after R1, and the log end pattern L2 as LBIST pattern R2. In an alternate embodiment, controller 110 selects the log interval 1, log start pattern L1, and log end pattern L2, based on input received from a user. Generally, log start pattern L1 and log end pattern L2 can be configured to bound a subset of the range R1 to R2. In one embodiment, log start pattern L1 identifies the first output signature stored in the trace array, and log end pattern L2 identifies the last output signature stored in the trace array, as described below.

Next, as illustrated at block 325, a controller applies LBIST patterns R1 to R2 to a device under test (DUT). For example, controller 110 directs test engine 114 to apply LBIST patterns R1 to R2 to DUT 102. In an alternate embodiment, the DUT itself applies LBIST patterns R1 to R2. Next, as illustrated at block 330, a trace array captures every $I^{th}$ output, up to M outputs, produced by DUT 102 in response to the applied LBIST patterns, from log start pattern L1 to log end pattern L2. In one embodiment, the trace array and the DUT are on the same chip. In one embodiment, a MISR or plurality of MISRs captures every $I^{th}$ output, and compacts the captured outputs into output signatures, up to M output signatures. For example, MISR 122 captures outputs 120 and generates M output signatures 124.

Next, as illustrated at block 335, a trace array stores captured outputs. For example, trace array 130 stores M output signatures 124. Next, as illustrated at block 340, a controller compares the output signatures in the trace array with known good signatures. For example, controller 110 compares the M output signatures 124 stored in trace array 130 with corresponding associated known good signatures in signature file 140.

Next, as illustrated at decisional block 345, a controller determines whether a LBIST pattern output signature does not match its corresponding associated known good signature, thereby indicating that there is a fault in the DUT. For example, controller 110 determines whether each output signature in trace array 130 matches its corresponding known good signature in signature file 140. Generally, a mismatch indicates a fault somewhere in the DUT.

If at block 345 no fault is indicated, the process follows the NO branch to block 350. As illustrated at block 350, because no fault is indicated, the device under test is operating correctly, and the process ends.

If at block 345 a fault is indicated, the process follows the YES branch to decisional block 355. As illustrated at decisional block 355, a controller determines whether an indicated fault is identified. For example, controller 110 determines whether the specific LBIST pattern has been identified that is causing a mismatch between the DUT output signature resulting from that LBIST pattern and the known good output signature for that LBIST pattern. In one embodiment, controller 110 determines whether the failing LBIST pattern has been isolated in trace array 130. For example, if trace array 130 contains an output signature for both LBIST pattern z and LBIST pattern z+1, and the output signature for LBIST pattern z matches its known good output signature, but the output signature for LBIST pattern z+1 does not match its known good output signature, controller 110 has identified the failing LBIST pattern as z+1.

If at decisional block 355 the controller has identified the failing LBIST pattern, the process continues along the YES branch to block 360. As illustrated at block 360, the controller reports the identified failing LBIST pattern and the process ends. In one embodiment, controller 110 reports the identified failing LBIST pattern by providing output to a user. In an alternate embodiment, controller 110 reports the identified failing LBIST pattern by setting a bit in an array representing the N LBIST patterns.

If at decisional block 355 the controller has not identified the failing LBIST pattern, the process continues along the NO branch, returning to block 315, wherein the controller selects a new range R1 to R2, to narrow the search parameters to identify the failing LBIST pattern, and the process continues as described above. Thus, in one embodiment, the process continues until the controller identifies the failing LBIST pattern, if any. One skilled in the art will understand that selection of the range R1 to R2, the log interval 1, the log start pattern L1, and the log end pattern L2 can result in improved identification of failing LBIST patterns.

For example, in one embodiment, the LBIST engine and the controller operate together as an LBIST controller. A user specifies the starting pattern count (M) and the number of intermediate patterns (I) between each signature collection, that is, the log interval. At each interval 1, the trace array stores the output signature captured by the MISR. Once the LBIST controller has finished applying the M test patterns, the LBIST controller reads the stored MISR output signatures from the trace array and compares those outputs to their expected values. The LBIST controller runs the next test batch (the new range of LBIST patterns) such that M is equal to $M+((V-1)*I)$ where M and I are the values from the previous test, V is the entry index of the first failing signature. Then, the LBIST controller sets I to I/E, where I is the value from the previous test, and E is the maximum number of MISR outputs that can be stored in the trace array. The LBIST controller repeats this procedure until the test where I=1 has been completed, at which point the first failing MISR output would indicate the exact LBIST pattern that is producing the fail. In one embodiment, the process is automated and the LBIST controller reports the failing pattern, if any. In an alternate embodiment, a user configures the settings for each test run based on the results of the previous test runs or other suitable information.

In another example, for a DUT tested with 1 million LBIST patterns, where the $264,004^{th}$ LBIST pattern fails, N is 1 million. For a trace array with 10 available entries, M is 10. For the first run, I is 100,000, and R1/L1 is 1, R2/L2 is 1 million. In an alternate embodiment, I is one tenth of the range R1 to R2. In an alternate embodiment, I is 1/M times the range R1 to R2. In an alternate embodiment, I is one tenth of the log start/end range L1 to L2. In an alternate embodiment, I is 1/M times the log start/end range L1 to L2.

The system applies the first 100,000 LBIST patterns, and stores the resultant MISR signature in the first slot of the trace array. The system applies the second 100,000 LBIST patterns (100,001 to 200,000) and stores the resultant MISR signature in the second slot of the trace array. In this manner, the system captures MISR signatures at 300 k, 400 k, etc., up to and including the 1 millionth LBIST pattern, storing the captured MISR signatures in the trace array.

The system compares the signatures in the trace array to identify a fault (failing LBIST pattern). In one embodiment, the system begins the comparison with the last LBIST pattern (here, the 1 millionth LBIST pattern), as a match in the last LBIST pattern indicates that all previous LBIST patterns have passed. In the example, the system finds that the first (100,000) and second (200,000) output MISR signatures pass, but the third output MISR signature (at 300,000) and beyond fail.

The system then narrows the range for the second run, such as, for example, to where R1 is 1, and R2 is 300,000. Thus, by narrowing the LBIST pattern range on the second run to end at the first failing output MISR signature, the novel embodiments disclosed herein reduce the number of LBIST patterns that must be reapplied to the DUT, as compared to the conventional binary search or n-tree approaches.

In an alternate embodiment, the system changes the log start pattern L1 to 200,001 and the log end pattern L2 to 300,000. As such, in some systems (where the full set of LBIST patterns must be applied for every test, for example), L1 and L2 reduce the number of output MISR signatures considered for capture, which reduces some of the power consumption and time required to run the tests. These advantages are even more pronounced where the system changes both the range (R1 to R2) and the log start/end patterns (L1 to L2).

For the second run, R1 is 1, R2 is 300,000, L1 is 200,000, L2 is 300,000, and I is 10,000. For the second run, the system applies the first 210,000 LBIST patterns, and stores the resultant MISR signature in the first slot of the trace array. The system applies the next 10,000 LBIST patterns (210,001 to 220,000) and stores the resultant MISR signature in the second slot of the trace array. In this manner, the system also captures MISR signatures at 230 k, 240 k, etc., up to and including the 300 thousandth LBIST pattern, storing the captured MISR signatures in the trace array.

The system now compares the output MISR signatures of the second run with the known good signatures. Here, because LBIST pattern 264,004 fails, the signatures at 210 k, 220 k, 230 k, 240 k, 250 k, and 260 k all pass. The signatures at 270 k, 280 k, 290 k, and 300 k, all fail.

The system adjusts the ranges accordingly, and for the third run, R1 is 1, R2 is 270,000, L1 is 260,000, and L2 is 270,000. For this third run, the system applies LBIST patterns 1 to 270,000 to the DUT, capturing every $I^{th}$ LBIST pattern from 260,000 to 270,000. The system applies the first 260,000 LBIST patterns, and stores the resultant MISR signature in the first slot of the trace array. The system applies the next 1,000 LBIST patterns (260,001 to 261,000) and stores the resultant MISR signature in the second slot of the trace array. In this manner, the system also captures MISR signatures at 262 k, 263 k, etc., up to and including the 270 thousandth LBIST pattern, storing the captured MISR signatures in the trace array.

The system now compares the output MISR signatures of the third run with the known good signatures. Here, because LBIST pattern 264,004 fails, the signatures at 260 k, 261 k, 262 k, 263 k, and 264 k all pass. The signatures at 265 k, 266 k, 267 k, 268 k, 269 k, and 270 k, all fail.

The system adjusts the ranges accordingly, and for the fourth run, R1 is 1, R2 is 265,000, L1 is 264,000, and L2 is 265,000. For this fifth run, the system applies LBIST patterns 1 to 265,000 to the DUT, capturing every $I^{th}$ LBIST pattern from 264,000 to 265,000. The system applies the first 264,000 LBIST patterns, and stores the resultant MISR signature in the first slot of the trace array. The system applies the next 100 LBIST patterns (264,101 to 264,200) and stores the resultant MISR signature in the second slot of the trace array. In this manner, the system also captures MISR signatures at 264, 300, 264,400, etc., up to and including the 265 thousandth LBIST pattern, storing the captured MISR signatures in the trace array.

The system now compares the output MISR signatures of the fourth run with the known good signatures. Here, because LBIST pattern 264,004 fails, the signature at 264,000 passes, but the signatures at 264,100 and beyond all fail.

The system adjusts the ranges accordingly, and for the fifth run, R1 is 1, R2 is 264,100, L1 is 264,000, and L2 is 264,100. For this fifth run, the system applies LBIST patterns 1 to 264,100 to the DUT, capturing every $I^{th}$ LBIST pattern from 264,000 to 264,100. The system applies the first 264,000 LBIST patterns, and stores the resultant MISR signature in the first slot of the trace array. The system applies the next 10 LBIST patterns (264,001 to 264,010) and stores the resultant MISR signature in the second slot of the trace array. In this manner, the system also captures MISR signatures at 264, 020, 264,030, etc., up to and including the $264,100^{th}$ LBIST pattern, storing the captured MISR signatures in the trace array.

The system now compares the output MISR signatures of the fifth run with the known good signatures. Here, because LBIST pattern 264,004 fails, the signature at 264,000 passes, but the signatures at 264,010 and beyond all fail.

The system adjusts the ranges accordingly, and for the sixth run, R1 is 1, R2 is 264,010, L1 is 264,000, and L2 is 264,010. For this fifth run, the system applies LBIST patterns 1 to 264,010 to the DUT, capturing every $I^{th}$ LBIST pattern from 264,000 to 264,010, which in this case is every LBIST pattern from 264,000 to 264,010. The system applies the first 264,000 LBIST patterns, and stores the resultant MISR signature in the first slot of the trace array. The system applies the next LBIST pattern 264,001 and stores the resultant MISR signature in the second slot of the trace array. In this manner, the system also captures MISR signatures at 264,002, 264,003, etc., up to and including the $264,010^{th}$ LBIST pattern, storing the captured MISR signatures in the trace array.

The system now compares the output signatures of the sixth run with the known good signatures. Here, because LBIST pattern 264,004 fails, the signatures at 264,000, 264, 001, 264,002, and 264,003 all pass. But the signatures at 264,004 and beyond all fail. Thus, at the end of the sixth run, the trace array contains an output signature for both LBIST pattern z (264,003) and LBIST pattern z+1 (264,004), and the output signature for LBIST pattern z matches its known good output signature, but the output signature for LBIST pattern z+1 does not match its known good output signature. As such the system has identified the failing LBIST pattern as z+1 (264,004). One skilled in the art will appreciate that the novel embodiments described herein therefore identify failing LBIST patterns more quickly than conventional systems and methods.

Accordingly, the disclosed embodiments provide numerous advantages over other methods and systems. For example, as described above, the disclosed embodiments generally identify failing LBIST patterns in fewer steps than conventional methods. More particularly, a search to identify a failing LBIST pattern takes $\log_M$ (N) time, instead of $\log_2$ (N), where M is the number of trace array entries, and N is the number of LBIST patterns. One skilled in the art will appreciate that this is a significant advantage over a standard binary search method.

Further, the disclosed embodiments offer methods to implement these improved techniques with a minimum of additional hardware. In one embodiment, the novel method can be implemented readily using a suitably configured trace array, which can provide significant benefits with only moderate cost increases. The reduced test times required to identify failing LBIST patterns also provides cost saving benefits and reduced manufacturing testing. One skilled in the art will note other significant advantages that are readily apparent.

One skilled in the art will appreciate that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

What is claimed is:

1. A method for logic built-in self-test (LBIST) testing an electronic circuit, comprising:
   selecting a first log interval;
   selecting a first subset range of LBIST patterns from a plurality of LBIST patterns arranged in an order;
   wherein each LBIST pattern of the first subset range of LBIST patterns causes an associated output of an electronic circuit;
   selecting a first log start pattern from the first subset range of LBIST patterns;
   selecting a first log end pattern from the first subset range of LBIST patterns;
   testing an electronic circuit in a first test by applying to the electronic circuit the first subset range of LBIST patterns sequentially in the order, thereby generating a first plurality of associated outputs;
   storing a first subset of associated outputs based on the first plurality of associated outputs, the first log interval, the first log start pattern, and the first log end pattern; and
   comparing the first subset of associated outputs with known outputs to identify a first output mismatch.

2. The method of claim 1, further comprising:
   selecting a second log interval;
   selecting a second log start pattern, wherein the second log start pattern occurs earlier in the order than the LBIST pattern associated with the first output mismatch;

selecting a second log end pattern, wherein the second log end pattern occurs later in the order than the LBIST pattern associated with the first output mismatch;

selecting a second subset range of LBIST patterns from the plurality of LBIST patterns;

testing the electronic circuit in a second test by applying to the electronic circuit the second subset range of LBIST patterns sequentially in the order, thereby generating a second plurality of associated outputs;

storing a second subset of associated outputs based on the second plurality of associated outputs, the second log interval, the second log start pattern, and the second log end pattern; and comparing the second subset of associated outputs with known outputs to identify a second output mismatch.

3. The method of claim 2, further comprising identifying a failing LBIST pattern based on subsequent repetitions of the steps above.

4. The method of claim 3, further comprising identifying a failing portion of the electronic circuit based on the identified failing LBIST pattern.

5. The method of claim 2, wherein the second subset range ends at the second log end pattern.

6. The method of claim 1, wherein storing a first subset of associated outputs comprises:
ignoring the associated outputs of LBIST patterns earlier in the order than the first log start pattern;
for every first log interval of LBIST patterns between the first log start pattern and the first log end pattern, ignoring the associated outputs of every LBIST pattern except the last LBIST pattern of the first log interval of LBIST patterns and storing the last LBIST pattern of the first log interval; and
ignoring the associated outputs of LBIST patterns later in the order than the first log end pattern.

7. The method of claim 1, further comprising:
wherein selecting a first log interval comprises selecting the first log interval based on input from a user;
wherein selecting a first log start pattern comprises selecting the first log start pattern based on input from a user; and
wherein selecting a first log end pattern comprises selecting the first log end pattern based on input from a user.

8. The method of claim 1, wherein each associated output comprises a data compacted signature.

9. The method of claim 1, wherein the first log interval does not equal the second log interval.

10. A system, comprising:
a test engine configured to couple to a device under test (DUT), the DUT comprising a plurality of test stumps;
the test engine further configured to:
generate a plurality of logic built-in self-test (LBIST) patterns arranged in an order, wherein each LBIST pattern causes an associated output of the DUT; and
apply a first subset range of LBIST patterns from the plurality of LBIST patterns, thereby generating a first plurality of associated outputs;
a trace array coupled to the DUT and configured to:
receive each associated output of the first plurality of associated outputs; and
store a first subset of associated outputs based on the first plurality of associated outputs, a first log interval, a first log start pattern and a first log end pattern; and
a controller coupled to the test engine and the trace array, the controller configured to compare the first subset of associated outputs with known outputs to identify a first output mismatch.

11. The system of claim 10, further comprising:
wherein the test engine is further configured to:
apply a second subset range of LBIST patterns from the plurality of LBIST patterns, thereby generating a second plurality of associated outputs;
wherein the trace array is further configured to:
receive each associated output of the second plurality of associated outputs;
store a second subset of associated outputs based on the second plurality of associated outputs, a second log interval, a second log start pattern and a second log end pattern;
wherein the second log start pattern occurs earlier in the order than the LBIST pattern associated with the first output mismatch;
wherein the second log end pattern occurs later in the order than the LBIST pattern associated with the first output mismatch; and
wherein the controller is further configured to compare the second subset of associated outputs with known outputs to identify a second output mismatch.

12. The system of claim 11, wherein the second subset range ends at the second log end pattern.

13. The system of claim 10, wherein storing a first subset of associated outputs comprises:
ignoring the associated outputs of LBIST patterns earlier in the order than the first log start pattern;
for every first log interval of LBIST patterns between the first log start pattern and the first log end pattern, ignoring the associated outputs of every LBIST pattern except the last LBIST pattern of the first log interval of LBIST patterns and storing the last LBIST pattern of the first log interval; and
ignoring the associated outputs of LBIST patterns later in the order than the first log end pattern.

14. The system of claim 10, wherein the first log interval, the first log start pattern, and the first log end pattern comprise input received from a user.

15. A processor comprising a computer program product for logic built-in self-test (LBIST) testing an electronic circuit, the computer program product having a tangible computer-readable medium with a computer program embodied thereon, the computer program comprising:
computer code for selecting a first log interval;
computer code for selecting a first subset range of LBIST patterns from a plurality of LBIST patterns arranged in an order;
wherein each LBIST pattern of the subset range of LBIST patterns causes an associated output of an electronic circuit;
computer code for selecting a first log start pattern from the first subset range of LBIST patterns;
computer code for selecting a first log end pattern from the first subset range of LBIST patterns;
computer code for testing an electronic circuit in a first test by applying to the electronic circuit the first subset range of LBIST patterns sequentially in the order, thereby generating a first plurality of associated outputs;
computer code for storing a first subset of associated outputs based on the first plurality of associated outputs, the first log interval, the first log start pattern, and the first log end pattern; and
computer code for comparing the first subset of associated outputs with known outputs to identify a first output mismatch.

16. The processor of claim 15, wherein the computer program further comprises:

computer code for selecting a second log interval;
computer code for selecting a second log start pattern, wherein the second log start pattern occurs earlier in the order than the LBIST pattern associated with the first output mismatch;
computer code for selecting a second log end pattern, wherein the second log end pattern occurs later in the order than the LBIST pattern associated with the first output mismatch;
computer code for selecting a second subset range of LBIST patterns from the plurality of LBIST patterns;
computer code for testing the electronic circuit in a second test by applying to the electronic circuit the second subset range of LBIST patterns sequentially in the order, thereby generating a second plurality of associated outputs;
computer code for storing a second subset of associated outputs based on the second plurality of associated outputs, the second log interval, the second log start pattern, and the second log end pattern; and
computer code for comparing the second subset of associated outputs with known outputs to identify a second output mismatch.

17. The processor of claim 15, wherein the computer program further comprises computer code for identifying a failing LBIST pattern based on subsequent repetitions of the steps above.

18. The processor of claim 15, wherein storing a first subset of associated outputs comprises:
   ignoring the associated outputs of LBIST patterns earlier in the order than the first log start pattern;
   for every first log interval of LBIST patterns between the first log start pattern and the first log end pattern, ignoring the associated outputs of every LBIST pattern except the last LBIST pattern of the first log interval of LBIST patterns and storing the last LBIST pattern of the first log interval; and
   ignoring the associated outputs of LBIST patterns later in the order than the first log end pattern.

19. The processor of claim 15, wherein the computer program further comprises computer code for receiving input from a user selecting the first log interval, the first log start pattern, and the first log end pattern.

* * * * *